United States Patent
Kund et al.

(10) Patent No.: US 7,265,568 B2
(45) Date of Patent: *Sep. 4, 2007

(54) SEMI-CONDUCTOR COMPONENT TEST PROCESS AND A SYSTEM FOR TESTING SEMI-CONDUCTOR COMPONENTS

(75) Inventors: Michael Kund, Tuntenhausen (DE); Georg Müller, München (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/874,761

(22) Filed: Jun. 24, 2004

(65) Prior Publication Data

US 2005/0024058 A1    Feb. 3, 2005

(30) Foreign Application Priority Data

Jun. 24, 2003   (DE) .................... 103 28 709

(51) Int. Cl.
*G01R 31/02* (2006.01)
*G01R 31/26* (2006.01)

(52) U.S. Cl. .............. 324/765; 324/759; 324/764; 324/158.1

(58) Field of Classification Search ......... 324/765
See application file for complete search history.

(56) References Cited

U.S. PATENT DOCUMENTS

| | | | | |
|---|---|---|---|---|
| 5,465,850 A | * | 11/1995 | Kase | 209/573 |
| 6,066,822 A | * | 5/2000 | Nemoto et al. | 209/573 |
| 6,125,460 A | | 9/2000 | Sim | |
| 6,137,303 A | * | 10/2000 | Deckert et al. | 324/765 |
| 6,204,679 B1 | * | 3/2001 | Gray, III | 324/760 |
| 6,563,331 B1 | * | 5/2003 | Maeng | 324/760 |
| 6,732,053 B1 | * | 5/2004 | Aragona | 702/22 |
| 6,809,510 B2 | * | 10/2004 | Goetzke | 324/158.1 |

FOREIGN PATENT DOCUMENTS

EP    1 273 923    7/2001

\* cited by examiner

*Primary Examiner*—Ha Tran Nguyen
*Assistant Examiner*—Emily Y Chan
(74) *Attorney, Agent, or Firm*—Slater & Matsil, L.L.P.

(57) ABSTRACT

A semi-conductor component test process, and a system for testing semi-conductor components, with which several different semi-conductor-component tests can be conducted in succession. A computer installation, in particular a test apparatus is provided, with which test result data obtained from a first test is evaluated, and which causes a further test provided after the first test), to be performed in an amended fashion, or to be dispensed with, depending on the test result data obtained from the first test.

3 Claims, 3 Drawing Sheets

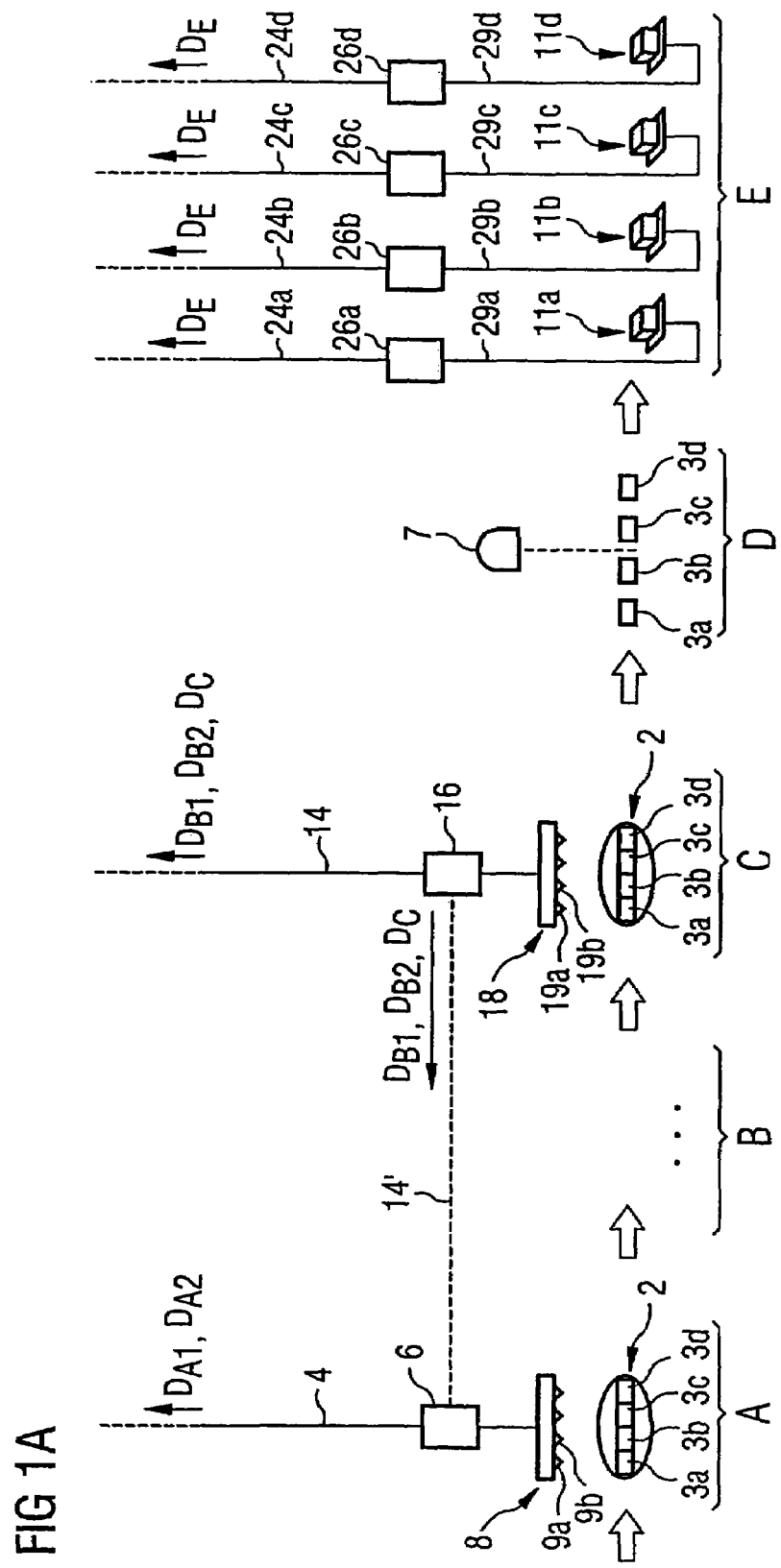

SEMI-CONDUCTOR COMPONENT TEST PROCESS AND A SYSTEM FOR TESTING SEMI-CONDUCTOR COMPONENTS

This application claims the benefit of priority to German Application No. 103 28 709.4, filed in the German language on Jun. 24, 2003, the contents of which are hereby incorporated by reference.

TECHNICAL FIELD OF THE INVENTION

The invention relates to a semi-conductor component test process, as well as a system for testing semi-conductor components, and in particular to a dynamically controlled test system, and/or a test system with automated adaptation of test results in the testing of integrated circuits.

BACKGROUND OF THE INVENTION

Semi-conductor components, for instance corresponding integrated (analog and/or digital) computer circuits, semi-conductor memory components, for instance functional memory components (PLAs, PALs, etc.) and table memory components (e.g. ROMs or RAMs, in particular SRAMs and DRAMs) are subjected to extensive testing during the manufacturing process.

For the simultaneous manufacture of numerous (generally identical) semi-conductor components, a so-called wafer (i.e. a thin disk of monocrystalline silicon) is used. The wafer is appropriately treated (for instance subjected in succession to numerous coating, exposure, etching, diffusion and implantation process steps, etc.), and then for instance sliced up (or scored and snapped off), so that the individual components become available.

During the manufacture of semi-conductor components (for instance DRAMs (Dynamic Random Access Memories and/or dynamic read-write memories), in particular of DDR-DRAMs (Double Data Rate—DRAMs and/or DRAMs with double data rate)) semi-completed components (still on the wafer) can be subjected—even before the above process steps required for the wafer have been completed (i.e. even while the semi-conductor components are still in a semi-complete state)—to appropriate test processes at one or more test stations (for instance so-called kerf measurements at the wafer scoring frame) with the aid of one or more testing apparatuses.

After their completion, (i.e. after completion of all the above wafer processing steps) the semi-conductor components are subjected to further test procedures at one or more (further) test stations—for instance the completed components—still on the wafer—can be appropriately tested with the aid of corresponding (additional) test equipment ("slice tests").

After the wafers have been sliced up (and/or scored and snapped off), the—individually available—components are then each loaded onto a so-called carrier (i.e. a suitable mounting), whereupon the semi-conductor components—loaded into the carrier—can be subjected to one or several (further) test procedures corresponding to other test stations.

In the same way, one or more further tests (at corresponding test stations and with the use of appropriate additional test equipment) can be performed, for instance after the semi-conductor components have been mounted into the corresponding semi-conductor component housing, and/or for instance after the semi-conductor component housing (together with the semi-conductor components mounted onto it in each case) has been mounted (for so-called module tests) into a corresponding electronic module.

While testing the semi-conductor components, the so-called "DC test" and/or for instance the so-called "AC test" may be applied as a test procedure (for instance for the above slice tests, module tests, etc.) in each case.

For the DC test for instance, a particular voltage (or current)—at a certain fixed level—can be applied to the appropriate connection of a semi-conductor component to be tested, whereafter the level of the—resulting current (and/or voltage) can be measured—in particular to ascertain whether this current (and/or voltage) falls within certain predetermined desired critical limits.

During an AC test in contrast, voltages (or currents)—in particular appropriate test sample signals—at varying levels can for instance be applied to the appropriate connections of a semi-conductor component, with the aid of which appropriate function tests can be performed on each corresponding semi-conductor component.

With the help of the above test procedures defective semi-conductor components can be identified and removed (or possibly even repaired in part).

Furthermore the results obtained in the above tests can for instance also be used to improve and/or optimize the process steps applied during the manufacture of the semi-conductor components (for instance the coating, exposure, etching, diffusion and/or implantation process steps, etc.) thereby improving the yield during the manufacture of such semi-conductor components.

In order to achieve this, an attempt must be made to ascertain from the results obtained in the above tests what the—physical—causes of any possibly occurring faults may be.

This is generally done manually in conventional processes and usually always by individually examining the results obtained from each of the above tests.

Such a manual evaluation of test results for improved/optimized yield is time-consuming and expensive and often does not lead to satisfactory results.

In addition, the application of the above tests is relatively costly and time-consuming.

For this reason it is attempted to test as many components as possible at the same time (so-called "parallel" testing).

For instance, all the semi-conductor components arranged on a particular wafer can be tested at the same time (so-called "maximum" parallelism).

If the (total) time required for testing the components is (further) reduced, it may in conventional test procedures cause a substantial deterioration in the test quality (for instance, because some or several tests may be dispensed with due to the time and/or cost restraints).

SUMMARY OF THE INVENTION

The invention discloses a semi-conductor component testing process, and a system for testing semi-conductor components, in particular a test procedure and/or system, in which the duration of the test (and/or the cost of the test) can be reduced while maintaining satisfactory test quality and/or the yield can be increased, compared to conventional test procedures and/or systems.

In one embodiment of the invention, there is a system for testing semi-conductor components, with which several different semi-conductor component tests can be performed in succession, wherein a computer installation, in particular a test apparatus, is provided, with which test results obtained from a first test are evaluated, and which causes—depending on the test result data obtained in the first test—a further test—provided after the first test—to be performed in a different fashion, or dispensed with.

Thereby, and with no (and/or with only slight) quality sacrifices, the duration of the test can be reduced, and/or the yield obtained during the semi-conductor component manufacture can be improved.

BRIEF DESCRIPTION OF THE DRAWINGS

The invention is described in more detail below with reference to the exemplary embodiments illustrated in the drawings, in which:

FIG. 1a shows stations that are passed through during the manufacture of corresponding semi-conductor components, and several test apparatuses forming part of a semi-conductor component testing system according to an embodiment of the invention.

DETAILED DESCRIPTION OF THE INVENTION

Figure 1B:
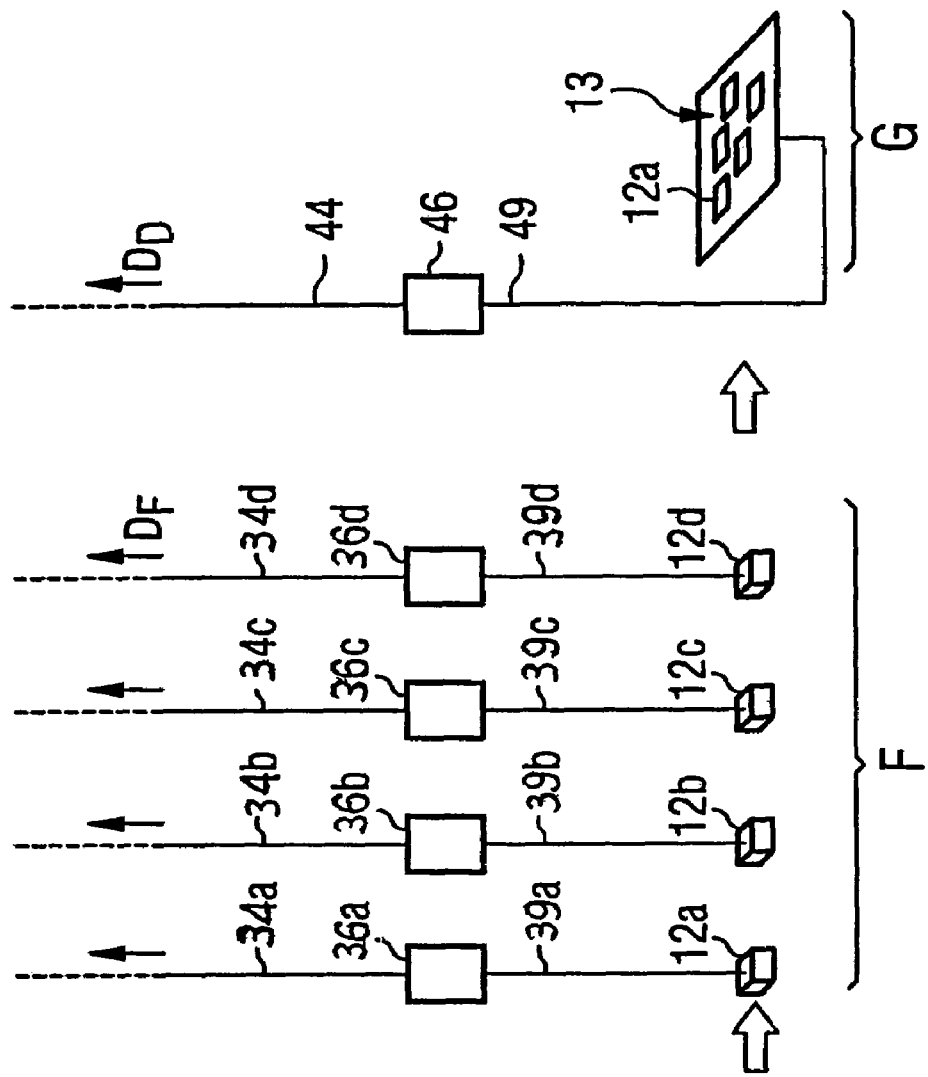
FIG. 1b shows stations passed through during the manufacture of corresponding semi-conductor components, and several further test apparatuses forming part of the semi-conductor component testing system.

FIGS. 1a and 1b show—in a schematic fashion—some of the stations A, B, C, D, E, F, G (of a multitude of further stations not shown here) corresponding to the semi-conductor components 3a, 3b, 3c, 3d and passed through during the manufacture of the corresponding semi-conductor components 3a, 3b, 3c, 3d (and/or electronic modules).

The semi-conductor components 3a, 3b, 3c, 3d may for instance be corresponding integrated (analog and/or digital) computer circuits, and/or semi-conductor memory components, for instance functional memory components (i.e. PLAs, PALs, etc.), and table memory components, (for instance ROMs or RAMs), in particular SRAMs or DRAMs (here for instance DRAMs (Dynamic Random Access Memories and/or Dynamic Read-Write Memories) with double data rate (DDR DRAMs=Double Data Rate–DRAMs), preferably high-speed DDR DRAMs).

During the manufacture of the semi-conductor components 3a, 3b, 3c, 3d, an appropriate silicon disk or an appropriate wafer 2 is subjected to corresponding conventional coating, exposure, etching, diffusion, and/or implantation process steps, etc.—for instance at corresponding stations placed in series upstream and downstream from the station A shown in FIG. 1a (for instance, station B placed after station A)— as well as at numerous further stations— not shown here—(placed before and after station A)).

Station A serves to subject the semi-conductor components 3a, 3b, 3c, 3d—still present on wafer 2—to one or more test procedures (test procedure A1 and/or test procedure A2 and/or test procedure A3, etc.) by means of a test apparatus 6—for instance so-called kerf measurements at the wafer scoring frame—(in fact—as is apparent from the embodiment examples above—even before all the above process steps required for wafer 2 have been completed (i.e. already during the half-completed state of the semi-conductor components 3a, 3b, 3c, 3d)).

The voltages/currents and/or test signals required at station A for testing the semi-conductor components 3a, 3b, 3c, 3d on wafer 2, are generated by the test apparatus 6, and fed to corresponding connections of the semi-conductor components 3a, 3b, 3c, 3d by means of the semi-conductor component probe card (test card) 8, which is connected to the test apparatus 6 (more precisely: by means of corresponding contact pins 9a, 9b provided on the probe card 8).

From station A, wafer 2 is (in particular fully automatically) transported to station B (and from there possibly to numerous further stations—not shown here), where—as already mentioned above—wafer 2 is subjected to further appropriate process steps (in particular to appropriate coating, exposure, etching, diffusion, and/or implantation process steps, etc.), and/or to further test procedures—correspondingly similar to those applied at station A.

After the semi-conductor components have been completed (i.e. after all the above wafer processing steps have been performed), wafer 2 is transported from the corresponding—previous—processing station (for instance from station B, or other further—downstream—stations) —in particular completely automatically—to the next station C.

Station C serves to subject the semi-conductor components 3a, 3b, 3c, 3d—completed and still present on the wafer 2—to one or more—further—test procedures, for instance so-called slice tests (test procedure C1, and/or test procedure C2, and/or test procedure C3, etc) by means of a test apparatus 16.

The voltages/currents and/or test signals required at station C for testing the semi-conductor components 3a, 3b, 3c, 3d on the wafer 2, are generated by test apparatus 16, and fed by means of a semi-conductor component probe card, 18 connected to the test apparatus 16, to the corresponding connections of the semi-conductor components 3a, 3b, 3c, 3d (more precisely: by means of corresponding contact pins 19a, 19b provided on probe card 18).

From station C wafer 2 is (in particular fully automatically) transported to the next station D, where (after wafer 2 has had foil glued to it in a recognized fashion) it is sliced up by means of an appropriate machine 7 (or for instance scored and snapped off), so that the semi-conductor components 3a, 3b, 3c, 3d then become—individually—available.

Before being transported to station D, wafer 2 and/or the components 3a, 3b 3c, 3d present on it may be subjected to one or more further test procedures at one or several stations corresponding with station C.

After wafer 2 has been sliced up at station D, each individual component 3a, 3b, 3c, 3d is then (preferably fully automatically) loaded into carriers 11a, 11b, 11c, 11d and/or holders 11a, 11b, 11c, 11d, whereafter the semi-conductor components 3a, 3b, 3c, 3d, loaded into carriers 11a, 11b, 11c, 11d, are transported to one or several (further) test stations for instance to the station E shown in FIG. 1a, and subjected to one or more further test procedures (test procedure E1, and/or test procedure E2, and/or test procedure E3, etc.), for instance to the so-called carrier tests.

For this, the carriers 11a, 11b, 11c, 11d are inserted into a corresponding carrier socket and/or carrier adapter, which is connected to one (or more) corresponding test apparatus (es) 26a, 26b, 26c, 26d via corresponding lines 29a, 29b, 29c, 29d.

The voltages/currents and/or test signals required at station E for testing the semi-conductor components 3a, 3b, 3c, 3d in the carriers 11a, 11b, 11c, 11d, are generated by the test apparatus(es) 26a, 26b, 26c, 26d, and fed to corresponding connections on the semi-conductor components 3a, 3b, 3c, 3d via the carrier socket connected via the lines 29a, 29b, 29c, 29d to the test apparatus(es) 26a, 26b, 26c, 26d, and to the carriers 11a, 11b, 11c, 11d connected to them.

From station E the semi-conductor components 3a, 3b, 3c, 3d are further transported (in particular completely automatically) to one or more station(s)—not shown here —where the semi-conductor components 3a, 3b, 3c, 3d are mounted into the corresponding housings 12a, 12b, 12c, 12d (for instance corresponding plug-in or surface-mounted component housings, etc.).

As shown in FIG. 1b, the semi-conductor components 3a, 3b, 3c, 3d—mounted into housings 12a, 12b, 12c, 12d are then further transported to one (or more) further test stations, for instance to the station F shown in FIG. 1b, and subjected to one or more further test procedures there (test procedure F1, and/or test procedure F2, and/or test procedure F3, etc.).

For this, the semi-conductor component housings 12a, 12b, 12c, 12d are inserted into corresponding component housing sockets and/or component housing adapters connected—via corresponding lines 39a, 39b, 39c, 39d—with one (or more) corresponding test apparatus(es) 36a, 36b, 36c, 36d.

The voltages/currents and/or test signals required at station F for testing the semi-conductor components 3a, 3b, 3c, 3d—mounted in the housings 12a, 12b, 12c, 12d—are generated by the test apparatus(es) 36a, 36b, 36c, 36d and fed via the lines 39a, 39b, 39c, 39d connected to the housing sockets and the test apparatus(es) 36a, 36b, 36c, 36d, and the component housings 12a, 12b, 12c, 12d connected to it, to corresponding connections on the semi-conductor components 3a, 3b, 3c, 3d.

From station F the semi-conductor components 3a, 3b, 3c, 3d mounted in the housing 12a, 12b, 12c, 12d can then, optionally, be transported to one or more further stations—not shown here—where a corresponding semi-conductor component housing (for instance the housing 12a, with the semi-conductor component 3a mounted in it), together with further components (analog and/or digital computer circuits, and/or semi-conductor memory components, for instance PLAs, PALs, ROMs, RAMS, in particular SRAMs or DRAMs, etc.)—is connected to a corresponding electronic module 13—for instance a circuit board.

As shown in FIG. 1b, the electronic module 13 (and thereby also the semi-conductor components 3a (mounted in a corresponding housing 12a), connected to the electronic module 13) can then, optionally, be transported further to one (or more) further test stations, for instance the station G shown in FIG. 1b, and there subjected to one or more further test procedures (test procedure G1, and/or test procedure G2, and/or test procedure G3, etc.), in particular to so-called module tests.

The voltages/currents and/or test signals required at station G for testing the module 13 (and thereby also the semi-conductor component 3a mounted in it) are for instance generated by a test apparatus 46, and fed via a line 49 to the electronic module 13, and thereby also to the corresponding connections of the corresponding semi-conductor components 3a mounted on it.

The above test procedures used for testing the semi-conductor components 3a, 3b, 3c, 3d (for instance at station A, and/or station C, and/or station E, and/or station F, and/or station G, and/or further stations not shown here) and/or those required for the test apparatus 6 and/or 16, and/or the test apparatuses 26a, 26b, 26c, 26d and/or 36a, 36b, 36c, 36d, and/or the test apparatus 46, and/or corresponding further test procedures—not shown in the illustrations—performed by test apparatuses (kerf measurements, slice tests, carrier tests, module tests, etc.) may in each involve the so-called DC tests, and/or for instance the so-called AC tests (whereby for instance in each case a DC or an AC test, or for instance both a DC as well as an AC test, or—in particular under different test conditions—several DC and/or several AC tests, can be performed at each of the above stations A, C, E, F, G—and/or corresponding stations not shown here—and/or by each of the above test apparatuses 6, 16, 26b, 26c, 26d, 36a, 36b, 36c, 36d, 46 —and/or test apparatuses corresponding to them and not shown here).

Figure 1C:
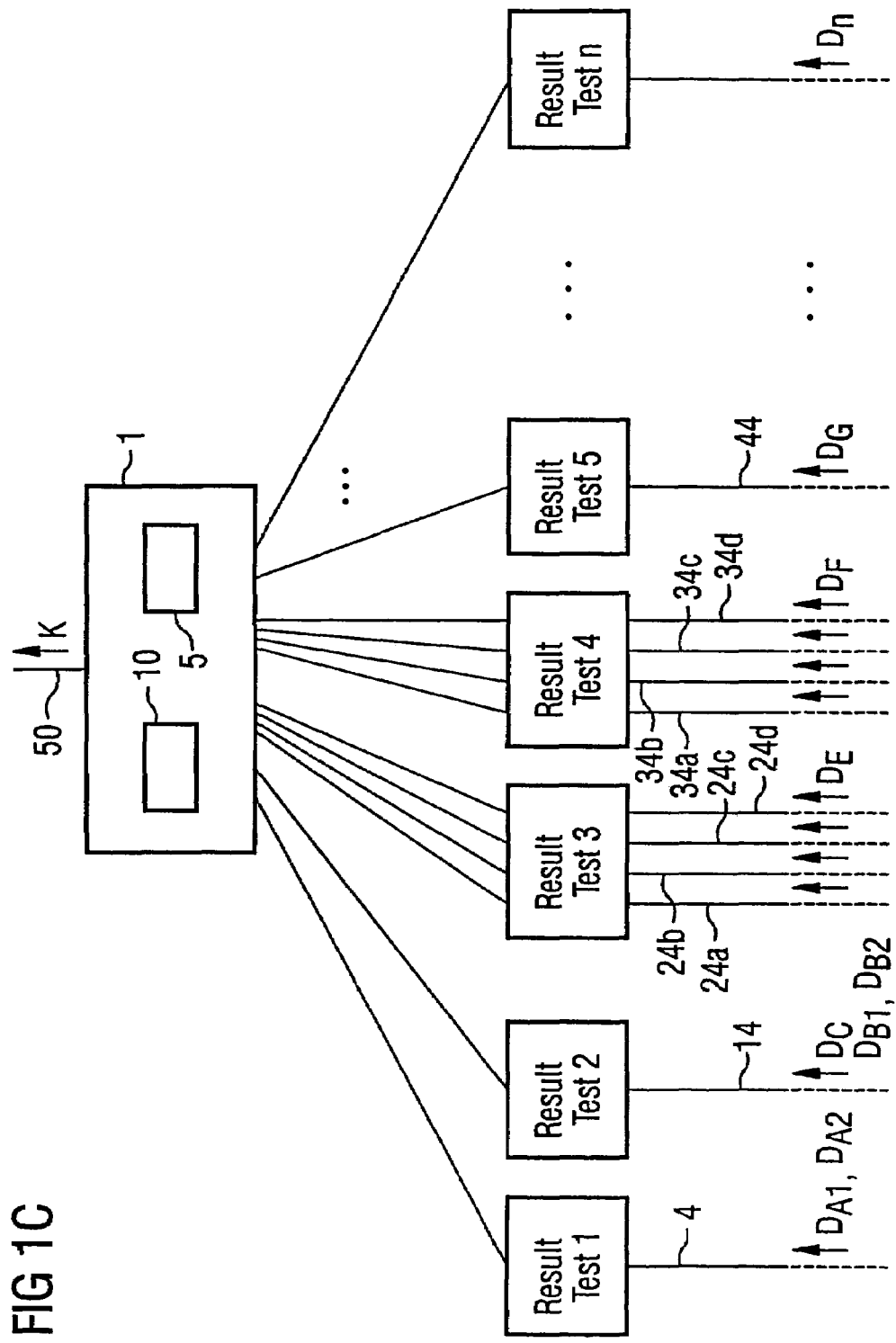
FIG. 1c shows a central computer installation forming part of the semi-conductor component test system with which, as an alternative to a central test apparatus, data derived from the test apparatuses can be processed.

In a DC test, a voltage (or current) at a specific, constant, level can for instance be fed by a corresponding test apparatus 6, 16, 26b, 26c, 26d, 36a, 36b, 36c, 36d, 46 to a corresponding connection of the semi-conductor components 3a, 3b, 3c, 3d to be tested, whereafter the levels of the resulting currents (and/or voltages) can be measured, and then evaluated by the corresponding test apparatuses 6, 16, 26b, 26c, 26d, 36a, 36b, 36c, 36d, 46, and for instance by each test apparatus 6, 16, 26b, 26c, 26d, 36a, 36b, 36c, 36d, 46, and/or, alternatively, by a (central) computer installation 1—shown in FIG. 1c (in particular for instance by testing whether these currents (and/or voltages) lie within predetermined desired critical limits (the (single) fault test), and/or in another special fashion, as more closely described below).

In contrast, in an AC test by the corresponding test apparatus 6, 16, 26b, 26c, 26d, 36a, 36b, 36c, 36d, 46, voltages (or currents) at varying levels can for instance be applied at the corresponding connections of the semi-conductor components 3a, 3b, 3c, 3d to be tested, in particular corresponding test signals, for instance test sample signals (i.e. a corresponding signal sequence and/or test pattern), with the help of which appropriate function and/or functionality tests can be performed at each semi-conductor component (for instance by detecting signals, in particular signal sequences generated by the semi-conductor component in response to the applied test signal and for instance evaluated by each of the test apparatuses 6, 16, 26a, 26b, 26c, 26d, 36a, 36b, 36c, 36d, 46, and/or, alternatively, by the (central) computer installation 1 shown in FIG. 1c (in particular for instance by testing whether the resulting signal sequences correspond with expected model signals, in particular with model signal sequences (the (single) fault test), and/or in another special fashion, described more closely below).

In the embodiment example shown here, several, in particular several different AC and/or DC tests, can be performed by one and the same test apparatus 6, 16, 26a, 26b, 26c, 26d, 36a, 36b, 36c, 36d, 46, for one and the same component 3a, and/or one and the same group of components, and/or for one and the same wafer 2, and/or for one and the same batch, etc., in particular several AC and/or DC tests under different test conditions in each case, (for instance several DC tests, each with varying levels of voltages (or currents) applied to the particular semi-conductor component, and/or several DC tests using voltages (or currents), applied in each case to different component connections, and/or several AC tests using different test signals in each case, in particular test patterns, and/or by using different component connections for signal input in each case, and/or by using different external and/or internal voltage and/or signal levels in each case, etc., etc. (test procedure A1 and/or A2 and/or A3 etc., and/or test procedure C1 and/or C2 and/or C3 etc., and/or test procedure E1 and/or E2 and/or E3 etc., and/or test procedure F1 and/or F2 and/or F3 etc., and/or test procedure G1 and/or G2 and/or G3).

In alternative embodiment examples—not shown here—the above test apparatuses 6, 16, 26a, 26b, 26c, 26d, 36a, 36b, 36c, 36d, 46 can be wholly or partly dispensed with; the corresponding voltages (or currents), and/or test signals to be applied at corresponding connections of the semi-conductor components 3a, 3b, 3c, 3 to be tested, for instance for performing AC and/or DC tests, can then be totally or partially generated by the above (central) computer installation 1.

As is apparent from FIG. 1c, the (central) computer installation 1, functioning here as a (central) test evaluation installation (as an alternative to, for instance, a corresponding test apparatus, for instance to the test apparatus 6 (see below)), correspondingly similar to conventional computers, in particular to PCs, work stations, or server computers, has one or more memory devices 10, as well as one or more processor devices, in particular one or more micro-processors 5.

In alternative embodiment examples not shown here, the function of the computer installation 1 shown in FIG. 1c can also be performed by several decentralized, coordinated computers (in particular corresponding——test apparatuses 6, 16, 26a, 26b, 26c, 26d, 36a, 36b, 36c, 36d, 46 working together).

Alternatively, the function of the computer installation 1, can for instance also (as already indicated above) be performed by one or several of the above test apparatuses 6, 16, 26a, 26b, 26c, 26d, 36a, 36b, 36c, 36d, 46, (for instance by the test apparatus 6).

As is apparent from FIGS. 1a, 1b and 1c in the embodiment example shown here, in contrast to state-of-the-art technology, the data (for instance the data $D_{A1}$, $D_{B1}$) obtained by one and the same test apparatus 6 during separate tests (for one and the same component 3a, and/or for one and the same group of components 3a, 3b, 3c, 3d, and/or for one and the same wafer 2, and/or for one and the same batch) and/or the data collected from separate tests (for one and the same component 3a, and/or for one and the same group of components 3a, 3b, 3c, 3d, and/or for one and the same wafer 2, and/or for one and the same batch) from various different test apparatuses 6, 16, 26a, 26b, 26c, 26d, 36a, 36b, 36c, 36d, 46 (for instance the data $D_{A1}$, $D_{A2}$, and/or the data $D_{B1}$, $D_{B2}$, and/or the data $D_C$, and/or $D_D$, and/or $D_E$, and/or $D_F$ (in particular the level of currents (and/or voltages)—arising in reaction to the voltages (and/or currents) applied to corresponding semi-conductor components, and/or the above signal emitted by corresponding semi-conductor components, in reaction to the applied test signal, in particular signal sequences (and/or the corresponding scanned signal values), etc.)) can be jointly evaluated, for instance by a corresponding test apparatus 6, 16, 26a, 26b, 26c, 26d, 36a, 36b, 36c, 36d, 46 (for instance the test apparatus 6), or for instance (alternatively), as shown in FIG. 1c as an example by the computer installation 1.

For this, the data is fed to $D_{A1}$, $D_{B1}$, $D_{A2}$, $D_{B2}$, $D_C$, $D_D$, $D_E$, $D_F$ at the corresponding test apparatus 6, or for instance to the computer installation 1, and stored there (for instance in the above computer installation memory device 10, or for instance in a corresponding memory device of the corresponding test apparatus 6).

For transferring the data $D_{A1}$, $D_{B1}$, $D_{A2}$, $D_{B2}$, $D_C$, $D_D$, $D_E$, $D_F$, the test apparatuses 6, 16, 26a, 26b, 26c, 26d, 36a, 36b, 36c, 36d, 46 can be connected to the (central) computer installation 1, (for instance via corresponding line connections, i.e. the corresponding lines 4, 14, 24a, 24b, 24c, 24d, 34a, 34b, 34c, 34d, 44, or alternatively for instance via corresponding wireless connections), and/or alternatively to the test apparatus 6 used for jointly evaluating the data (for instance via the data connection 14' shown in FIG. 1a by a broken line, as well as further data connections—not shown here—between the individual test apparatuses 6, 16, 26a, 26b, 26c, 26d, 36a, 36b, 36c, 36d, 46)).

The joint evaluation of the data $D_{A1}$, $D_{B1}$, $D_{A2}$, $D_{B2}$, $D_C$, $D_D$, $D_E$, $D_F$, derived from various tests, in the computer installation 1 (and/or alternatively: in a test apparatus, for instance the test apparatus 6), is automated, in particular performed in a fully automatic fashion.

Thereby the data $D_{A1}$, $D_{B1}$, $D_{A2}$, $D_{B2}$, $D_C$, $D_D$, $D_E$, $D_F$ obtained by the computer installation 1 (and/or alternatively: by the test apparatus 6) from at least two (in particular three or more) different tests (for instance several DC tests by the same test apparatus 6, or by several test apparatuses 6, 16, and/or several AC tests by the same test apparatus 6, or by several test apparatuses 6, 16, etc., etc.) is examined with regard to possible correlations and/or interrelations and/or patterns arising in this data, in particular—as is more closely described below—regarding correlations and/or interrelations and/or patterns between and/or with the data $D_{A1}$, $D_{B1}$, $D_{A2}$, $D_{B2}$, $D_C$, $D_D$, $D_E$, $D_F$, indicating a higher incidence of possible faults or failures in the tested semi-conductor components.

Alternatively or additionally, as also more closely described below, the above data $D_{A1}$, $D_{B1}$, $D_{A2}$, $D_{B2}$, $D_C$, $D_D$, $D_E$, $D_F$ (obtained from one or more different tests (by one or more test apparatuses 6, 16, etc.)) (for instance by investigating correlations and/or interrelations and/or patterns possibly occurring between and/or with this data) can for instance be investigated with regard to whether particular tests (test procedure A1 and/or A2 and/or A3 and/or C1 and/or C2 and/or C3 and/or E1 and/or E2 and/or E3 and/or F1 and/or F2 and/or F3 and/or G1 and/or G2 and/or G3, etc., etc.) are necessary at all, or may be dispensed with (for instance because they add no, or only minimal additional insights in relation to previously conducted tests (for instance in relation to the tests A1, A2, A3), and/or need to adapted and/or amended where needed for test optimization—for instance depending on previously conducted tests (for instance on tests A1, A2, A3) and/or the corresponding test results—(i.e. in place of test procedures A1, A2, A3, C1, C2, C3, E1, E2, E3, F1, F2, F3, G1, G2, G3, provided as standard etc. —an appropriately adapted and/or amended—optimized —test procedure A1', A2', A3', C1', C2', C3', E1', E2', E3', F1', F2', F3', G1', G2', G3', etc. is performed, for instance to improve the probability of correctly identifying a particular fault (for instance—with DC tests—with adapted/amended levels of voltages (or currents), and/or with adapted critical limits, and/or—with AC tests—with adapted and/or amended test signals, in particular test patterns, and/or by using adapted and/or amended external and/or internal voltage and/or signal levels, etc.)) applied to the semi-conductor component in question.

In order to investigate the data $D_{A1}$, $D_{B1}$, $D_{A2}$, $D_{B2}$, $D_C$, $D_D$, $D_E$, $D_F$ with regard to correlations and/or interrelations and/or patterns occurring between this data, the computer installation 1 (and/or alternatively: the test apparatus 6)(or several of the above test apparatuses)) can act correspondingly as a pattern recognition system, in particular for instance as a neural network.

For instance, a programmed pattern recognition software program, similar to conventional pattern recognition software programs—in particular a neural network software program—can be stored in the above computer installation memory device 10 (and/or alternatively: in a test apparatus memory device)—or any other further memory device.

Because of the large amount of data to be processed by the computer installation 1 (and/or the test apparatus 6), the above pattern recognition can alternatively be performed by hardware—and not software—for instance by providing a signal processing chip, for instance an ASICS—correspondingly arranged and installed, for instance in the computer installation 1 (and/or the test apparatus 6), etc.

The pattern recognition system created by the computer installation 1 (and/or alternatively by the test apparatus 6) is "trained" during a first phase (the "learning phase", in particular before actually starting to manufacture components, for instance before and/or during the introduction of new component technology) by the joint use of the above data $D_{A1}$, $D_{B1}$, $D_{A2}$, $D_{B2}$, $D_C$, $D_D$, $D_E$, $D_F$ obtained during the above test procedures A1, A2, A3, C1, C2, C3, E1, E2, E3, F1, F2, F3, G1, G2, G3 (or any part of it), whereby the data $D_{A1}$, $D_{B1}$, $D_{A2}$, $D_{B2}$, $D_C$, $D_D$, $D_E$, $D_F$ (and/or required parts of it)—as mentioned above—may on occasion also be examined for correlations and/or interrelations and/or patterns, for instance those indicating an increased likelihood of faults and/or failures in the tested semi-conductor components 3a, 3b, 3c, 3d. and/or, for instance in regard to whether particular tests—allocated to particular data—(test procedures A1 and/or A2 and/or A3 and/or C1 and/or C2 and/or C3 and/or E1 and/or E2 and/or E3 and/or F1 and/or F2 and/or F3 and/or G1 and/or G2 and/or G3, etc., etc.) aimed at recognizing faults or their likelihood, for instance regarding tests already done before (for instance the tests A1, A2, A3), bring no or minimal additional information (and which may therefore be dispensed with), and/or for instance with regard to whether particular tests could be optimized by being adapted and/or amended as needed, for instance depending on the results obtained from tests (for instance the tests A, A2, A3) already done before.

For this, the computer installation 1 (and/or alternatively: the test apparatus 6) can, for instance, possibly manually be provided with additional data $D_G$ by one of the above test apparatuses 6, 16, 26a, 26b, 26c, 26d, 36a, 36b, 36c, 36d, 46 in particular for instance appropriate fault analysis data $D_G$, which indicates whether a corresponding semi-conductor component 3a, 3b, 3c, 3d, for instance during a final control (and/or during one or more of the above (single) fault tests)(and in which test exactly) has been tested as faulty or fault-free, and/or which fault exactly occurred in each case, and in which test, etc.

Each individual data value of the above data $D_{A1}$, $D_{B1}$, $D_{A2}$, $D_{B2}$, $D_C$, $D_D$, $D_E$, $D_F$ (and/or each individual test value (current, voltage, kerf parameter, etc.)) creates a so-called "feature" to be used in pattern recognition.

These different "features", used for pattern recognition and/or data $D_{A1}$, $D_{B1}$, $D_{A2}$, $D_{B2}$, $D_C$, $D_D$, $D_E$, $D_F$ used for tests, relating for instance to a particular tested semi-conductor component 3a (and/or a particular tested group of semi-conductor components 3a, 3b, 3c, 3d, a particular tested wafer 2, a particular tested batch, etc.), always cover a so-called pattern recognition feature vector in the pattern recognition feature area (for instance n features examined during pattern recognition, and/or n bits of data examined during pattern recognition (relating in each case to a particular tested semi-conductor component, wafer, batch, etc.) are combined to create an n-dimensional feature vector).

During the above learning phase, the above pattern recognition system in each case investigates several such corresponding (for instance n-dimensional) feature vectors (whereby—as mentioned—each individual vector relates to a particular tested semi-conductor component 3a (and/or a particular tested group of semi-conductor components 3a, 3b, 3c, 3d, a particular tested wafer 2, a particular tested batch, etc.) (and/or to the corresponding test relating to them), and each of the above feature vectors correspondingly relates to, for instance sequentially tested semi-conductor components (and/or groups of sequentially tested semi-conductor components, wafers, etc.).

In other words, in the embodiment examples shown here, the above tests (test procedures A1, A2, A3, C1, C2, C3, E1, E2, E3, F1, F2, F3, G1, G2, G3, etc.) are performed in succession on several different semi-conductor components (and/or various groups of semi-conductor components, wafers, etc.), whereby a pattern recognition feature vector, in each case corresponding with the above, for instance n-dimensional pattern recognition feature vector (with the corresponding features and/or data $D_{A1}$, $D_{B1}$, $D_{A2}$, $D_{B2}$, $D_C$, $D_D$, $D_E$, $D_F$) is determined.

Thereupon, again in relation to a particular semi-conductor-component 3a (and/or a particular group of semi-conductor component 3a, 3b, 3c, 3d, a particular wafer 2, a particular batch, etc.), the above tests can be performed again, whereby one or more of the above tests is performed in the above adapted and/or amended fashion (i.e. instead of the test procedure C1 for instance the—adapted and/or amended test procedure C1' (or a further test procedure C1", different to the test procedure C1, C1'), etc. is performed, for instance the test procedure C1 is performed (with adapted and/or amended levels of the voltages (or currents) fed to each semi-conductor-component), and/or with adapted critical limits, etc.)). This procedure can repeatedly be performed in succession on several different semi-conductor components (and/or different groups of semi-conductor components, wafers, etc.), and for any combination of tests that have been amended or not (so that further pattern recognition feature vectors, relating to amended and/or adapted tests, are generated).

The pattern recognition feature vectors are examined by the above pattern recognition system, for instance by making appropriate comparisons between individual vectors and/or the data values they include, to determine whether particular patterns occur in them in each case, which indicate an increased likelihood of faults or failure in the tested semi-conductor components 3a, 3b, 3c, 3d, and/or in relation to tests, allocated to particular data, (for instance the tests C1, C2, C3, etc.), which bring no or minimal additional information (and which may therefore be dispensed with) in relation to results achieved during tests previously conducted (for instance to tests A1, A2, A3) in relation to recognizing faults and/or their likelihood and/or in relation to whether particular tests (for instance the tests C1, C2, C3, etc.), with regard to results obtained from tests previously performed (for instance the tests A1, A2, A3), may need to be adapted and/or amended for test optimization.

After the above first phase ("learning phase"), more closely described below by means of an example, it can be decided by the above pattern recognition system during a second phase, with a high degree of probability, (in particular after the actual start of component manufacturing, for instance after introducing new technology (i.e. during "normal" manufacture)) based solely on data $D_{A1}$, $D_{B1}$, $D_{A2}$, $D_{B2}$, $D_C$, $D_D$, $D_E$, $D_F$ measured in each case (i.e. on the feature vector determined in each case)(i.e. without fault analysis, in particular without separate compilation of fault analysis data $D_G$), on the presence of corresponding faults in relation to a particular semi-conductor component 3a (and/or a particular group of semi-conductor components 3a, 3b, 3c, 3d, a particular wafer 2, a particular batch etc, in fact by examining the above data $D_{A1}$, $D_{B1}$, $D_{A2}$, $D_{B2}$, $D_C$, $D_D$, $D_E$, $D_F$ (if required, as obtained above), in accordance with the results obtained in the above "learning phase", for the existence of patterns indicating particular faults.

Furthermore, alternatively or additionally, in the second phase, for a particular semi-conductor component 3a (and/or a particular group of semi-conductor components 3a, 3b, 3c, 3d, a particular wafer 2, a particular batch, etc.), the data $D_{A1}, D_{B1}, D_{A2}, D_{B2}, D_C, D_D, D_E, D_F$ measured in each case (i.e. the feature vector obtained in each case) can be investigated by the pattern recognition system to determine whether particular patterns in each case occur in it (them), identifying those tests that bring no or minimal additional information with regard to the results obtained from previously conducted tests for the recognition of faults and/or their likelihood (and may therefore be dispensed with), and/or whether particular tests, with regard to the results obtained in previously obtained tests for the recognition of faults and/or their likelihood, should be adapted and/or amended where needed for test optimization.

For instance, the above test procedure A1 is first performed at test station A, and the measured data $D_{A1}$ ((partial) feature vector) is subjected to the above pattern recognition process by test apparatus 6 (or by the computer installation 1), (and it is decided on the basis of the measured data $D_{A1}$ whether one or more test procedures provided as standard at test station A, and/or succeeding test stations C, E, F, G may be dispensed with, and/or whether one or more of these test procedures should be performed in an amended fashion).

The corresponding test procedure control data K (indicating that a particular test procedure should not be performed, and/or that a particular test procedure should be performed in an amended fashion (and with which parameters exactly)) is for instance fed via a line 50—shown in FIG. 1c—by the computer installation 1 to the corresponding test apparatus 6, 16, 26a, 26b, 26c, 26d, etc., or for instance via the above lines 4, 14, 24a, 24b, 24c, 24d (or—for instance via the line 14', and/or via further lines, not shown here, from test apparatus 6 to the corresponding test apparatuses 16, 26a, 26b, 26c, 26d, etc.).

The above test procedure A2 is then for instance performed at the above test station A, and the measured data $D_{A2}$, together with the data $D_{A1}$ measured at the test procedure A1, is again subjected to the above pattern recognition process by test apparatus 6 (or the computer installation 1) and it is decided, depending on the measured data $D_{A1}$ and $D_{A2}$, whether one or more test procedures following on test procedures A1, A2, provided as standard at test station A, and/or at succeeding test stations C, E, F, G, may be dispensed with (here for instance the test procedure A3—otherwise usually foreseen—), and/or whether one or more of these test procedures should be performed in an amended fashion), etc.

The next, required, test procedure C1 is then performed at the succeeding test station C, and the measured data $D_{B1}$—from the test apparatus 16 (or the computer installation 1, or the test apparatus 6), subjected to the above pattern recognition process together with the data $D_{A1}, D_{A2}$, measured at the preceding test procedures A1, A2,—(and it is decided on the basis of the measured data $D_{A1}, D_{A2}, D_{B1}$, whether one or more test procedures following the test procedure C1, provided as standard at test station C, and/or at succeeding test stations E, F, G, may be dispensed with and/or whether one or more of these test procedures should be performed in an amended fashion).

Corresponding test procedure control data (indicating that a particular test procedure should not be performed, and/or that a particular test procedure should be performed in an amended fashion (and with which parameters exactly)) is for instance fed via line 50—shown in FIG. 1c—from the computer installation 1 to the corresponding test apparatus 16, 26a, 26b, 26c, 26d, etc., or for instance via the above lines 14, 24a, 24b, 24c, 24d (or, for instance via line 14', and/or via further, lines not shown here, from test apparatus 6 (or from test apparatus 16) to the corresponding test apparatuses 16, 26a, 26b, 26c, 26d, etc.), etc.

In this way the semi-conductor component test system shown here can be used dynamically to control and optimize all the test procedures adopted in each case.

For the above pattern recognition, no knowledge of the physical causes of the interrelationship between particular measurement result combinations (and/or particular patterns of the data $D_{A1}, D_{B1}, D_{A2}, D_{B2}, D_C, D_D, D_E, D_F$ and/or data values in each pattern recognition feature vector), and their related failure mechanisms is obligatory; instead the interrelationship can be empirically determined in each case.

Below several highly simplified examples are explained for a better understanding of that mentioned above:

During the learning phase a fault is for instance determined, for instance at a concluding single-fault test, for instance an AC functionality test (and/or a functionality test in a later phase of the semi-conductor component manufacturing process)—in numerous semi-conductor components (wafers, batches, etc.).

During preceding single DC and/or kerf tests (single-fault tests) the currents (voltages) measured during these tests on the corresponding semi-conductor components (wafers, batches, etc.) always fell within the critical limits accepted for each individual test.

Due to the above pattern recognition it could be empirically determined that whenever during a first, preceding test (DC and/or kerf test) a particular measured current (or a particular measured voltage) was particularly high (while still falling within acceptable critical limits in each case), and at the same time during a second preceding test (a DC and/or kerf test) a particular measured current (or a particular measured voltage) was also particularly high (or for instance particularly low) ("fault pattern"), increased faults would occur at the above, concluding, functional test.

A similar fault pattern and/or further (possibly substantially more complicated) fault patterns could be automatically recognized (as described above) by the above pattern recognition system, during the above first phase (learning phase), by means of an appropriate pattern recognition process.

After the learning phase (i.e. during the above second phase) the pattern recognition system then (re)recognizes feature patterns, with a relatively high probability of causing a fault (for instance, as illustrated above, a relatively high level of a current (and/or voltage—measured at a first test—), and at the same time a relatively high (or low) value of a current (and/or voltage—measured at a second test—)) and allocates it with the appropriate probability to the corresponding fault mechanism.

In reaction to this (and/or in reaction to the detection of one or more feature combination(s) indicating an increased probability of a fault) the computer installation 1 (or alternatively the test apparatus 6) can automatically institute an appropriate adaptation of the process parameters applied during the manufacture of the semi-conductor component (for instance an adaptation of corresponding process parameters during the above coating, exposure, etching, diffusion and/or implantation process steps, etc.), and in fact by the computer installation 1 (or alternatively the test apparatus 6) emitting process control data to a process control installation, (here: for instance via the above line 50), that causes a corresponding change in the process parameters Hereby the yield achieved by the semi-conductor component manufacturing process can be improved.

Furthermore, during the learning phase it can also be determined that whenever the data $D_{A1}$, $D_{B1}$ obtained from particular tests (for instance the test procedures A1 and C1, in particular that obtained during pattern recognition, remains below particular critical limits, a fault is never (or hardly ever) determined at a subsequent test (for instance at the test procedure E1) so that this test can be dispensed with, without any or with very little loss of quality, thereby reducing the test time.

Furthermore, for example when the capacity of a memory cell, determined during a parameter test, and the leakage current achieve their desired values, the so-called "short retention tests" can be dispensed with during subsequent slice tests, because all the chips should pass these tests, while no additional information about the chip quality would be gained.

Furthermore, for a particular test (for instance for a so-called "BLC test" (FE slice test)) one of the parameters, for instance the voltage threshold value (for instance the Vt-Vpp threshold value) used during that test can be adapted, for instance depending on the test procedure control data obtained from the test apparatus (for instance depending on a voltage (for instance the voltage Vt) measured at a preceding test (for instance a parameter test)).

In this way it can be avoided that chips with a relatively high measured voltage are erroneously rejected, whereby the achieved yield is (further) increased.

What is claimed is:

1. A method for testing semi-conductor components having a training phase and a testing phase, the training phase comprising:
  performing a first training test on a plurality of semi-conductor components to obtain first training test result data;
  performing a second training test on the plurality of semi-conductor components to obtain second training test result data;
  performing a third training test on the plurality of semi-conductor components different from the first and the second training test to obtain third training test result data; and
  jointly analyzing the first training test result data, the second training test result data and the third training test result data to determine a pattern indicating that third test of the testing phase may be dispensed with; and the testing phase, comprising:
  performing a first test on a semi-conductor component to obtain first test result data;
  performing a second test on the semi-conductor component to obtain second test result data; and
  jointly analyzing the first and second test result data to predict whether the third test different from the first and second test may be dispensed with based on the pattern determined in the training phase.

2. The method of claim 1, wherein the jointly analyzing the first and second test result data comprises determining whether the first and second test result data are mutually correlated.

3. A system for testing semi-conductor components, comprising:
  at least one testing apparatus to perform a training phase, including:
  performing a first training test on a plurality of semi-conductor components to obtain first training test result data;
  performing a second training test on the plurality of semi-conductor components to obtain second training test result data;
  performing a third training test on the plurality of semi-conductor components different from the first and the second training test to obtain third training test result data; and
  jointly analyzing the first training test result data) the second training test result data and the third training test result data to determine a pattern indicating that a third test of a testing phase may be dispensed with; and the at least one testing apparatus performing the testing phase, including:
  performing a first test on a semi-conductor component to obtain first test result data;
  performing a second test on the semi-conductor component to obtain second test result data; and
  jointly analyzing the first and second test result data to predict whether the third test different from the first and second test may be dispensed with based on the pattern determined in the training phase.

* * * * *

UNITED STATES PATENT AND TRADEMARK OFFICE
CERTIFICATE OF CORRECTION

PATENT NO. : 7,265,568 B2 Page 1 of 1
APPLICATION NO. : 10/874761
DATED : September 4, 2007
INVENTOR(S) : Kund et al.

It is certified that error appears in the above-identified patent and that said Letters Patent is hereby corrected as shown below:

In Col. 14, line 1, insert --a-- after "that".
In Col. 14, line 31, delete "data)" and insert --data,--.

Signed and Sealed this

Twentieth Day of November, 2007

JON W. DUDAS
*Director of the United States Patent and Trademark Office*